United States Patent
Gill

(12) 
(10) Patent No.: US 6,452,763 B1
(45) Date of Patent: Sep. 17, 2002

(54) GMR DESIGN WITH NANO OXIDE LAYER IN THE SECOND ANTI-PARALLEL PINNED LAYER

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 09/588,253

(22) Filed: Jun. 6, 2000

(51) Int. Cl.[7] .............................. G11B 5/127; G11B 5/33
(52) U.S. Cl. .................................................. 360/324.11
(58) Field of Search ........................ 360/324.11, 324.1, 360/324, 313, 110, 126

(56) References Cited

U.S. PATENT DOCUMENTS

| | | | | |
|---|---|---|---|---|
| 5,880,913 A | * | 3/1999 | Gill | 360/24.11 |
| 5,898,549 A | * | 4/1999 | Gill | 360/324.11 |
| 5,995,342 A | * | 11/1999 | Cohen et al. | 360/126 |
| 6,278,592 B1 | * | 8/2001 | Xue et al. | 360/324.12 |
| 2002/0041473 A1 | * | 4/2002 | Hoshiya et al. | 360/324.11 |

OTHER PUBLICATIONS

US PAP No. 2001/0020884 A1 Araki et al Sep. 13, 2001.*

* cited by examiner

Primary Examiner—Robert S. Tupper
Assistant Examiner—Julie Anne Watko
(74) Attorney, Agent, or Firm—Brian C. Kunzler

(57) ABSTRACT

A high GMR coefficient for a spin valve sensor is achieved through the addition of one or more nano oxide layers in the second anti-parallel (AP) pinned layer of the pinned section of a spin valve sensor. The improvement occurs through increases in the GMR coefficient and magnetic stability of the spin valve sensor. The new second anti-parallel AP-pinned layer is formed with a plurality of layers of a magnetized metal separated by nano oxide layers. The metal layer(s) preferably comprise CoFe and the nano oxide layers preferably comprise of CoFeO. A PtMn antiferromagnetic layer and a CoFe first AP-pinned layer may also be used.

20 Claims, 7 Drawing Sheets

GMR DESIGN WITH NANO OXIDE LAYER IN THE SECOND ANTI-PARALLEL PINNED LAYER

BACKGROUND OF THE INVENTION

1. The Field of the Invention

The present invention relates generally to spin valve magnetic transducers for reading information signals from a magnetic medium and, in particular, to a novel structure in the second anti-parallel (AP)-pinned layer for a spin valve sensor, and to magnetic recording systems which incorporate such sensors.

2. The Relevant Art

Computer systems generally utilize auxiliary memory storage devices having media on which data can be written and from which data can be read for later use. A direct access storage device, such as a disk drive, incorporating rotating magnetic disks is commonly used for storing data in magnetic form on the disk surfaces. Data is recorded on concentric, radially spaced tracks on the disk surfaces. Magnetic heads carrying read sensors are then used to read data from the tracks on the disk surfaces.

In high capacity disk drives, magnetoresistive read sensors, commonly referred to as MR heads, are now the most common type of read sensors. This is largely due to the capability of MR heads of reading data on a disk of a greater linear density than that which the previously used thin film inductive heads are capable of. An MR sensor detects a magnetic field through a change in resistance in its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect. In an SV sensor, one of the ferromagnetic layers, referred to as the pinned layer, has its magnetization typically pinned by exchange coupling with an antiferromagnetic (e.g., NiO or Fe—Mn) layer.

The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage. It should be noted that the AMR effect is also present in the SV sensor free layer and it tends to reduce the overall GMR effect.

FIG. 1 shows a typical prior art SV sensor 100 comprising a pair of end regions 104 and 106 separated by a central region 102. The central region 102 is formed by a suitable method such as sputtering and has defined end regions that are contiguous with and abut the edges of the central region. A free layer (free ferromagnetic layer) 110 is separated from a pinned layer (pinned ferromagnetic layer) 120 by a non-magnetic, electrically-conducting spacer layer 115. The magnetization of the pinned layer 120 is fixed through exchange coupling with an antiferromagnetic (AFM) layer 121.

The free layer 110, spacer layer 115, pinned layer 120 and AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current I, from a current source 160 to the MR sensor 100. A sensing device 170 connected to the leads 140 and 145 senses the change in the resistance due to changes induced in the free layer 110 by an external magnetic field (e.g., a field generated by a data bit stored on a disk). IBM's U.S. Pat. No. 5,206,590 granted to Dieny et al. and incorporated herein by reference, discloses an MR sensor operating on the basis of the SV effect.

Another type of spin valve sensor recently developed is an anti-parallel (AP)-pinned spin valve sensor. FIG. 2 shows one representative AP-pinned SV sensor 200. The AP-pinned SV sensor 200 has a pair of end regions 202 and 204 separated from each other by a central region 206. The AP-pinned SV sensor 200 is also shown comprising a Ni—Fe free layer 225 separated from a laminated AP-pinned layer 210 by a copper spacer layer 220. The magnetization of the laminated AP-pinned layer 210 is fixed by an AFM layer 208 which is made of NiO.

The laminated AP-pinned layer 210 includes a first ferromagnetic layer 212 of cobalt and a second ferromagnetic layer 216 of cobalt separated from each other by a ruthenium (Ru) antiparallel coupling layer 214. The AFM layer 208, AP-pinned layer 210, copper spacer 220, free layer 225 and a cap layer 230 are all formed sequentially in the central region 206. A pair of hard bias layers 235 and 240, formed in the end regions 202 and 204, provide longitudinal biasing for the free layer 225.

A pair of electrical leads 245 and 250 are also formed in end regions 202 and 204, respectively, to provide electrical current from a current source (not shown) to the SV sensor 200. In the depicted example, the magnetization direction of the free layer 225 is set parallel to the air bearing surface (ABS) in the absence of an external field. The magnetization directions of the pinned layers 212 and 214, respectively, are also set to be perpendicular to the ABS. The magnetization directions of the pinned layers are shown as coming out of the Figure at 260 and going in at 255. The magnetization of the free layer 225 is shown set to be parallel to the ABS.

The disk drive industry has been engaged in an ongoing effort to increase the overall sensitivity, or GMR coefficient, of the SV sensors in order to permit the drive head to read smaller changes in magnetic flux. Higher GMR coefficients enable the storage of more bits of information on any given disk surface and ultimately provide for higher capacity disk drives without a corresponding increase in the size or complexity of the disk drives. The GMR coefficient of an SV sensor is defined as $\Delta R/R$, or the change in resistance of the sensor material, divided by the overall resistance of the material when the sensor material is subjected to a changing magnetic field. The GMR coefficient is dependent on both the "softness" of the material and its overall resistance.

A change in resistance of the sensor material can be easily measured only if the change is large compared to the overall resistance R of the material. Thus, a low overall resistance R, combined with a high change in magnetoresistance, $\Delta R$, will produce a high GMR coefficient.

Other properties relevant to the performance of a GMR head include magnetostriction, exchange coupling between the AFM and the pinned layer or layers, and the electrical resistivity of the AFM. Magnetostriction is a measure of the stress or deformation of a material when it undergoes a change in magnetism. It is desired in the construction of spin valves to keep magnetostriction to a minimum because deformation of the GMR head materials can cause poor interfacing between layers and nonlinear performance as magnetic flux changes.

Exchange coupling between the AFM and the pinned layers is important because magnetic flux from the AFM must reach the pinned layer with a minimum of reluctance or leakage in order to keep the magnetic moment of the pinned layer at a consistent orientation. An inadequate exchange coupling may cause poor pinning, thereby reducing the sensitivity of the GMR head.

It is also vital that the current through the spin valve sensor be confined to the pinned and sensing portions of the spin valve sensor. If current is permitted to shunt through the AFM layer, the magnetoresistance recorded by the sensor will be artificially low, thus producing a lower GMR coefficient and a nonlinear signal. Thus, the material selected for the AFM layer must possess a high electrical resistivity in order to prevent shunting.

Prior art read heads have been produced by forming a seed or buffer layer on or near the substrate, and then forming the remaining layers on top of the seed layer. The crystalline structure and orientation of the seed layer helps determine the configuration of the remaining layers. Materials such as NiFe have previously been used to form all or part of the seed layer.

The GMR coefficient of a spin valve sensor is highly dependent upon the specular scattering that occurs within the pinned layer of the sensor. The amount of specular scattering that occurs within the pinned layer is directly related to the construction and composition of the anti-parallel (AP) layers within the spin valve sensors. While prior art read heads have improved upon the amount of specular scattering that occurs, it is believed that even greater improvements can be achieved. For instance, it is believed that an improved structure and composition of the pinned layer would provide increased specular scattering, and, in turn, improved performance of the overall disk drive system.

OBJECTS AND BRIEF SUMMARY OF THE INVENTION

The apparatus of the present invention has been developed in response to the present state of the art, and in particular, in response to the problems and needs in the art that have not yet been fully solved by currently available spin valve sensors. Accordingly, it is an overall object of the present invention to provide an improved spin valve sensor that overcomes many or all of the above-discussed shortcomings in the art.

To achieve the foregoing object, and in accordance with the invention as embodied and broadly described herein in the preferred embodiments, a spin valve sensor is provided and configured with a plurality of laminated layers in the second anti-parallel (AP)-pinned layer.

The spin valve sensor of the present invention in one embodiment comprises a second anti-parallel AP-pinned layer that comprises plurality of thin laminated metal layers separated by thin metal oxide layers. In one embodiment, the thin metal laminate layers in the second AP-pinned layer are formed of CoFe and the thin metal oxide layers are formed of CoFeO. The use of thin metal laminate layers separated by metal oxides provides an increase in electron scattering within the pinned layer. This increase in scattering, in turn, causes an increased GMR coefficient and substantially improves the overall performance of the spin valve sensor.

It is important to the overall function of the spin valve sensor that the layers in the pinned region remain constantly exchange-coupled to one another. Through the use of very thin, or nano oxide, layers in the second AP-pinned layer as described in the current invention, it is possible to increase electron scattering within the second AP-pinned layer while maintaining the exchange coupling throughout the pinned layer as a whole. It is important to note that the use of thick layers in the second AP-pinned layer will generally cause the layers to no longer be exchange coupled.

The spin valve sensor may comprise a cap layer, a free layer, a pinned layer of ferromagnetic material as discussed above, an antiferromagnetic (AFM) layer, a substrate, and a seed layer. In one embodiment, the AFM layer is formed of PtMn and the first anti-parallel (AP1)-pinned layer is formed of Co or CoFe. Nevertheless, the pinned layer of the present invention is intended for use with any type of spin valve sensor having a suitable construction.

The spin valve sensor of the present invention may be incorporated within a disk drive system comprising a magnetic recording disk; an anti-parallel AP-pinned spin valve (SV) sensor configured in the manner discussed above; an actuator for moving the spin valve sensor across the magnetic recording disk so the spin valve sensor may access different regions of magnetically recorded data on the magnetic recording disk; and a detector. The detector may be electrically coupled to the spin valve sensor for detecting changes in resistance of the sensor caused by rotation of the magnetization axis of the free ferromagnetic layer relative to the fixed magnetization of the AP-pinned layer in response to magnetic fields from the magnetically recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
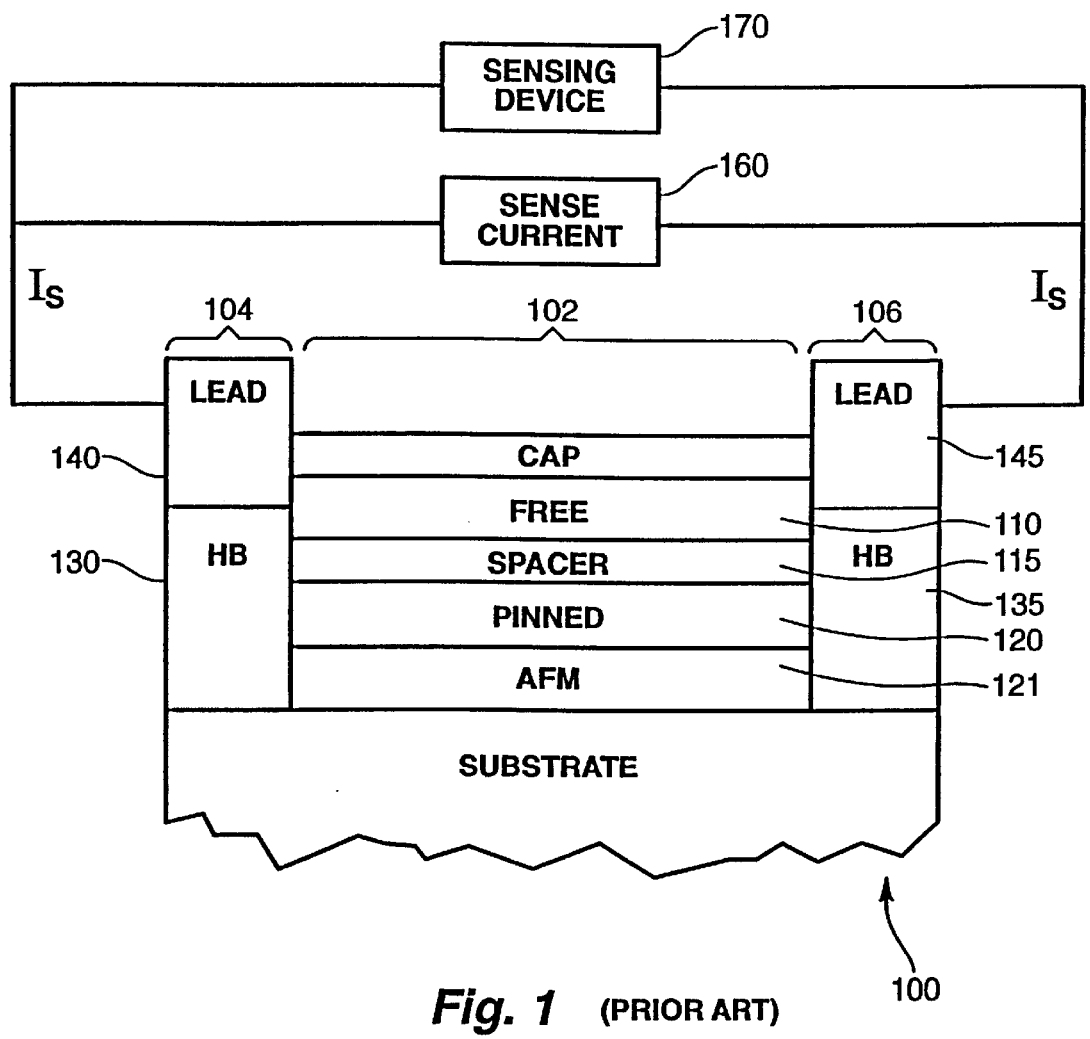
FIG. 1 is a cross-sectional view illustrating the composition of a spin valve sensor of the prior art.
Figure 2:
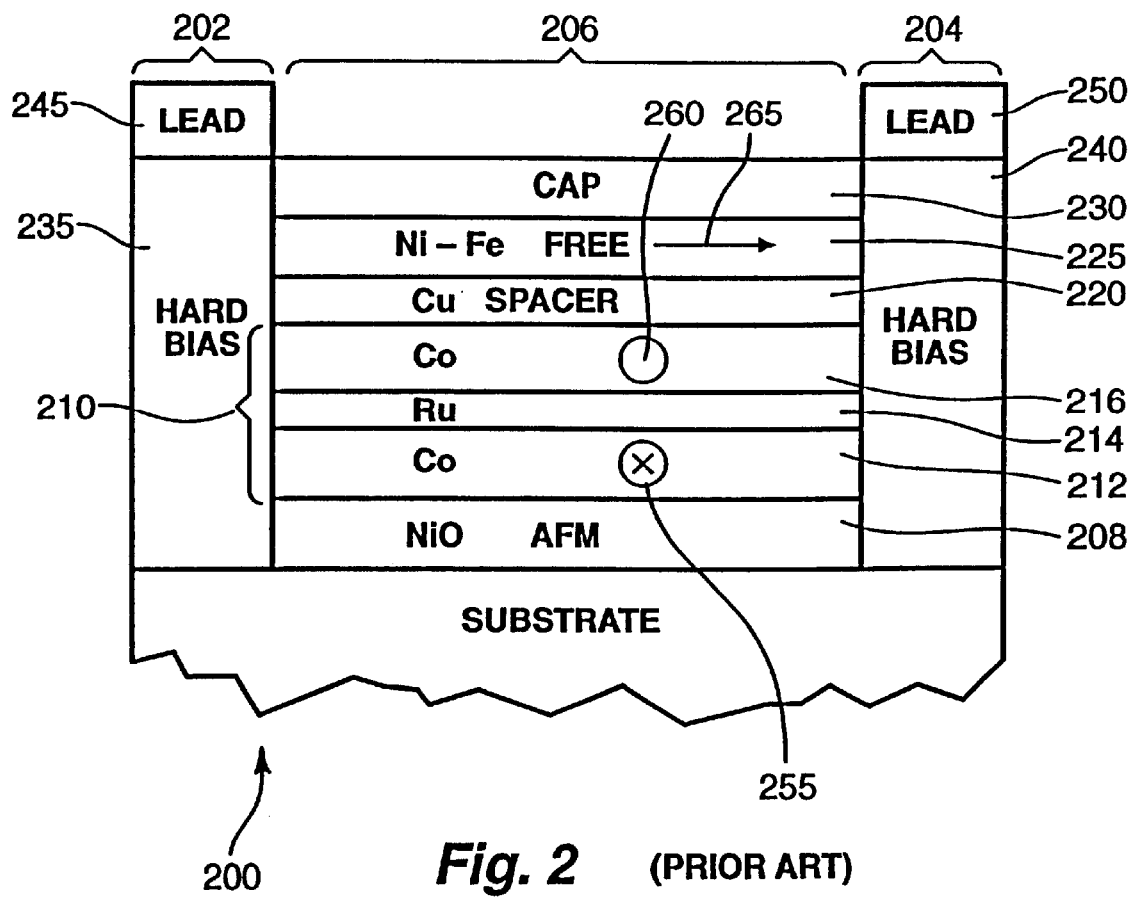
FIG. 2 is a cross-sectional view illustrating the composition of an AP-pinned spin valve sensor of the prior art.
Figure 3:
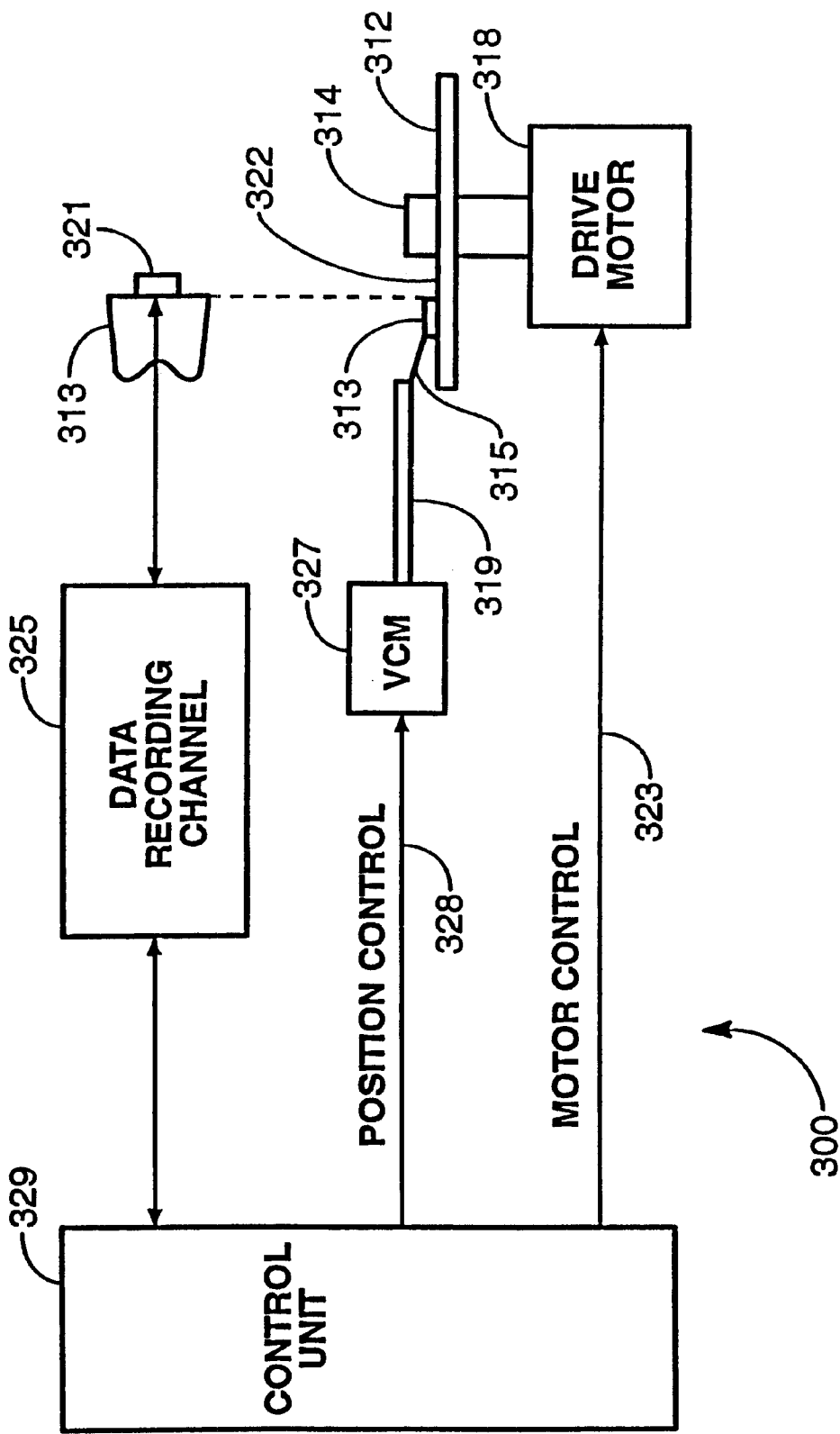
FIG. 3 is a schematic block diagram illustrating one embodiment of a magnetic recording disk drive system of the present invention.

FIG. 3 shows one example of a disk drive 300 embodying the present invention. As shown in FIG. 3, the disk drive 300 comprises at least one rotatable magnetic disk 312 supported on a spindle 314 and rotated by a disk drive motor 318. The magnetic recording media on each magnetic disk 312 is in the form of concentric, annular data tracks (not shown).

At least one slider 313 is positioned on the disk 312. Each slider 313 supports one or more magnetic read/write heads 321 incorporating the GMR sensor of the present invention. As the disks rotate, the slider 313 is moved radially in and out over the disk surface 322 so that the heads 321 may access different portions of the magnetic disk 312 where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327.

The actuator 327 as shown in FIG. 3 may be a voice coil motor (VCM). The VCM comprises a coil movable within a fixed magnetic field, and the direction and speed of the coil movements are controlled by the motor current signals supplied by a controller 329.

During operation of the disk storage system, the rotation of the magnetic disk 312 generates an air bearing between the slider 313 (the surface of the slider 313, which includes head 321 and faces the surface of disk 312, is referred to as an air bearing surface (ABS)) and the disk surface 322 which exerts an upward force or lift on the slider 313. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329. The control signals include access control signals and internal clock signals. Typically, the control unit 329 comprises logic control circuits, storage means, and a microprocessor. The control unit 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from the read/write heads 321 by means of a recording channel 325. In the depicted embodiment, the read/write heads 321 incorporate a GMR sensor including a spin valve of the present invention.

Figure 4:
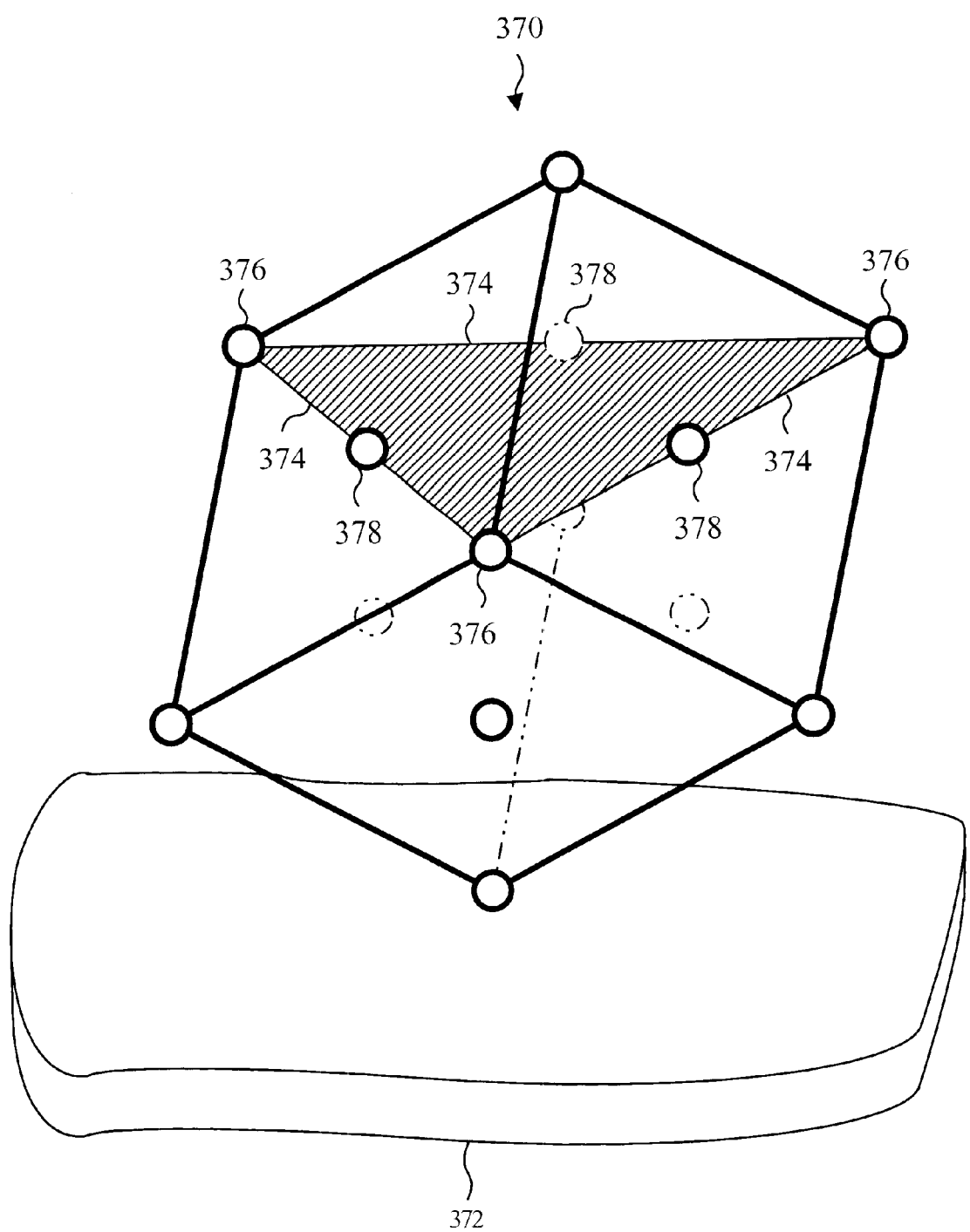
FIG. 4 is a perspective view of a microscopic portion of a face centered cubic (FCC) seed layer for an SV head according to the invention, with a (111) plane parallel to the substrate of the head.

Referring to FIG. 4, many of the materials used in the read/write heads 321 have an FCC, or Face-Centered Cubic, structure. It has been discovered that atoms in an FCC structure are most tightly and consistently arranged along the (111) crystallographic plane. Thus, the read/write head 321 is believed to function optimally when the FCC materials in the read/write head 321 are oriented so that the (111) plane is parallel to the substrate. In FIG. 4, a cube-shaped sample 370 of FCC material is shown positioned over a substrate 372. The (111) plane 374 is positioned parallel to the substrate. Three corner atoms 376 and three face-centered atoms 378 within the cube-shaped sample 370 are located within the (111) plane 374, and are spaced apart relatively evenly, with small distances between adjacent atoms.

When the (111) plane 374 is exposed to form an interface for subsequent layers, the crystalline structures of the new layers are formed in alignment with that of the seed layer. Interfaces between layers have few discontinuities (misaligned sets of atoms) or interstices (open spaces where atoms should be). Consequently, the (111) plane 374 is an effective foundation for the growth of tightly bonded, even-textured layers.

Furthermore, layer textures are improved when the lattice constants of adjacent layers are similar. The lattice constant of a crystalline material is defined as the smallest distance between adjacent atoms in a crystal. Similar lattice constants permit the crystals of adjacent layers to align with each other to produce a homogeneous grain boundary with few irregularities.

Figure 5:
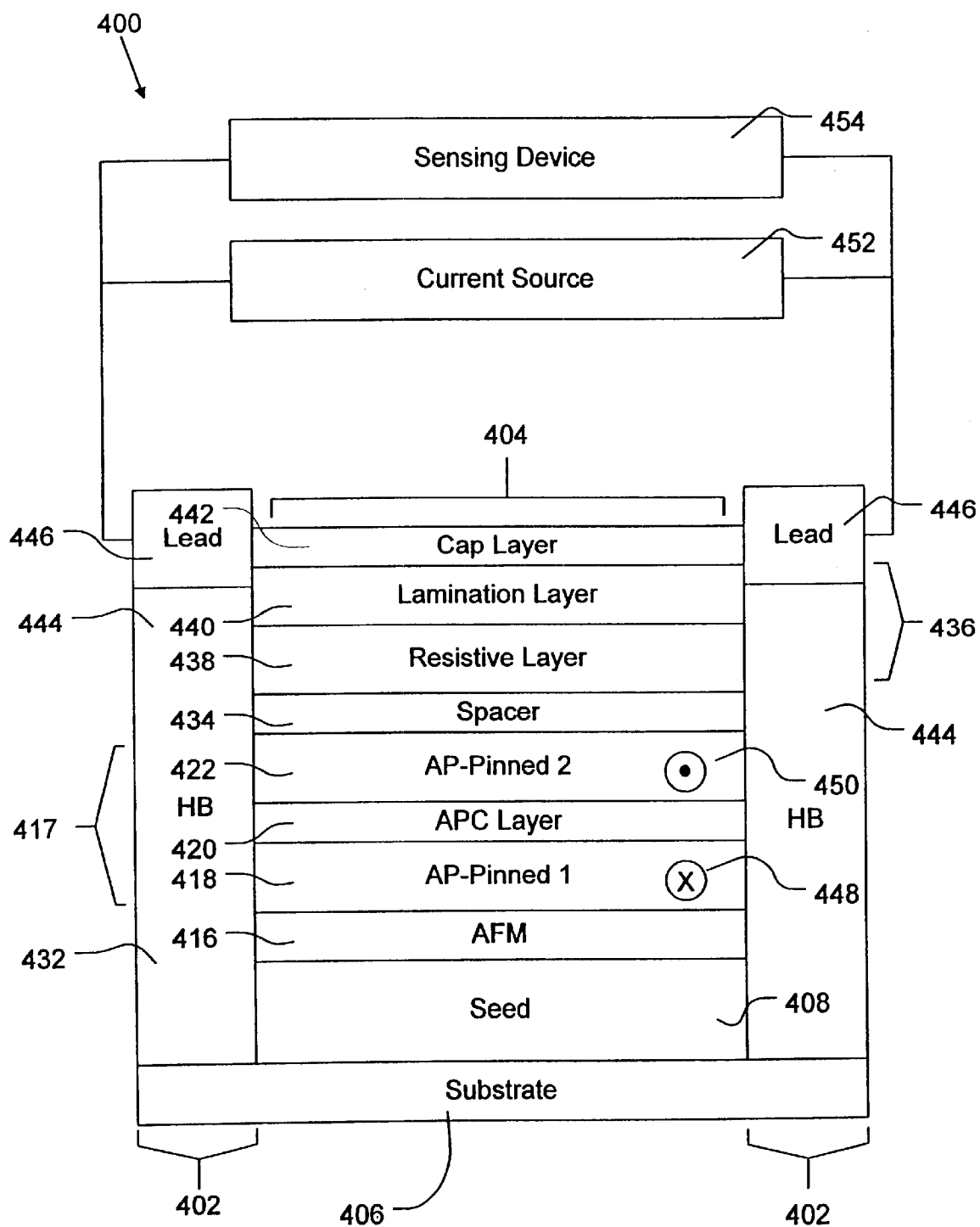
FIG. 5 is a cross-sectional view illustrating the composition of one embodiment of a bottom AFM spin valve sensor incorporating a second anti-parallel (AP)-pinned layer according to the present invention.

FIG. 5 shows an air bearing surface (ABS) view of one embodiment of a spin valve sensor 400 of the present invention. The spin valve sensor 400 is formed with a plurality of laminated layers in the second anti-parallel (AP)-pinned layer according to the present invention.

The spin valve sensor 400 of FIG. 5 is shown with a pair of end regions 402 separated from each other by a central region 404. The central region 404 has defined edges where the end regions 402 form a contiguous junction with and abut the edges. The sensor 400 is built upon a substrate 406 which may be any suitable material, including glass, semiconductor material, or a ceramic material, such as alumina ($AL_2O_3$). The substrate 406 may also comprise a shield layer and a gap layer as is known to those skilled in the art. In the following description, "above" means further from the substrate 406 and "below" means closer to the substrate 406. Likewise, "bottom" layers are those closest to the substrate 406, and the "top" layers are those furthest from the substrate 406.

Figure 7:
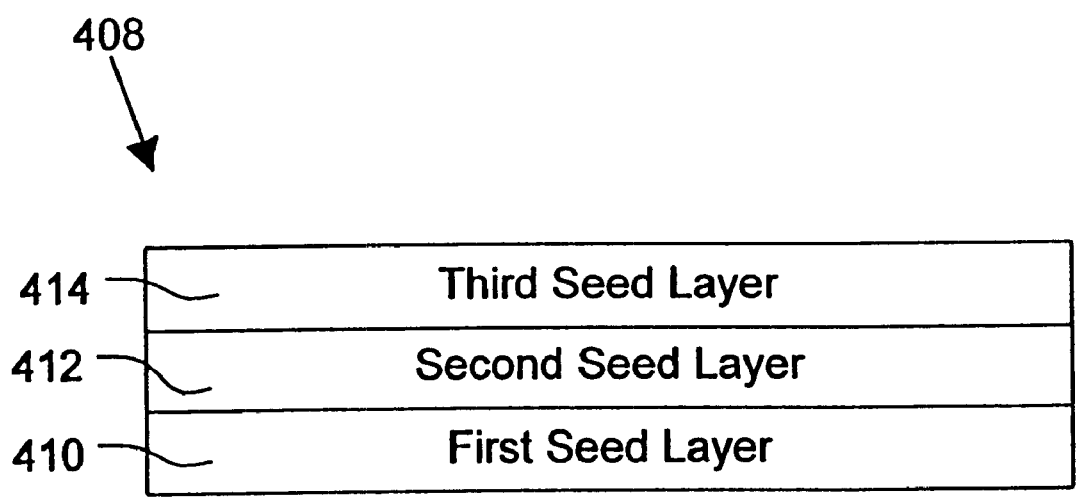
FIG. 7 is a cross-sectional view illustrating the composition of one embodiment of a seed layer according to the present invention.

A seed layer 408 is preferably formed on top of the substrate 406. The seed layer 408 may be configured in a number of different ways according to the invention. FIG. 7 shows one embodiment of the seed layer 408 in which the seed layer comprises a first seed layer 410, a second seed layer 412, and a third seed layer 414.

The first seed layer 410 is preferably formed of Aluminum Oxide and preferably has a thickness in a range of between about 25 Å and about 35 Å, with a more preferred thickness of about 30 Å. The second seed layer 412 is preferably formed of Nickel Manganese Oxide and preferably has a thickness in a range of between about 25 Å and about 35 Å, with a more preferred thickness of about 30 Å. The third seed layer 414 is preferably formed of one of the materials selected from the group consisting of NiFeNb, NiFeCr, Ta and Zr. Preferably, the third seed layer 414 has a thickness in a range of between about 25 Å and about 35 Å, with a more preferred thickness of about 30 Å.

The primary function of the seed layer 408 is to form a foundation for the growth of the layers on top of it. Thus, it is preferred under the present invention that the materials used to form the seed layer 408 have an FCC structure that forms with a (111) plane parallel to the substrate 406, as described in connection with FIG. 4. It has been discovered that if the (111) plane of the seed layer 408 is parallel to the substrate 406, subsequent FCC layers formed over the seed layer 408 will form with a substantially consistent crystalline structure and orientation.

An antiferromagnetic (AFM) layer 416 is preferably formed over the seed layer 408 in the central region 404. Alternatively, the AFM layer 416 may be formed in both the central region 404 as well as in the end regions 402. The AFM layer 416 is preferably formed of Platinum Manganese (PtMn) and is preferably formed with a thickness in a range of between about 100 Å and about 250 Å with a more preferred thickness of about 150 Å.

A pinned layer 417 is shown formed over the AFM layer 416. In the depicted embodiment, the pinned layer 417 comprises the first and second AP-pinned layers 418 and 422. In the depicted embodiment, the first and second AP-pinned layers 418 and 422 are separated from each other by an anti-parallel coupling (APC) layer 420 which is preferably formed of a nonmagnetic material that provides strong antiferromagnetic coupling between the first and second AP-pinned layers 417 and 422. Although any suitable nonmagnetic material may be used to form the anti-parallel coupling layer 418, Ru is preferred.

The first AP-pinned layer 417 may include suitable materials such as Fe and Co. For example, the first AP-pinned layer 416 may be a layer of Co or CoFe deposited on and in contact with the AFM layer 416.

Figure 6:
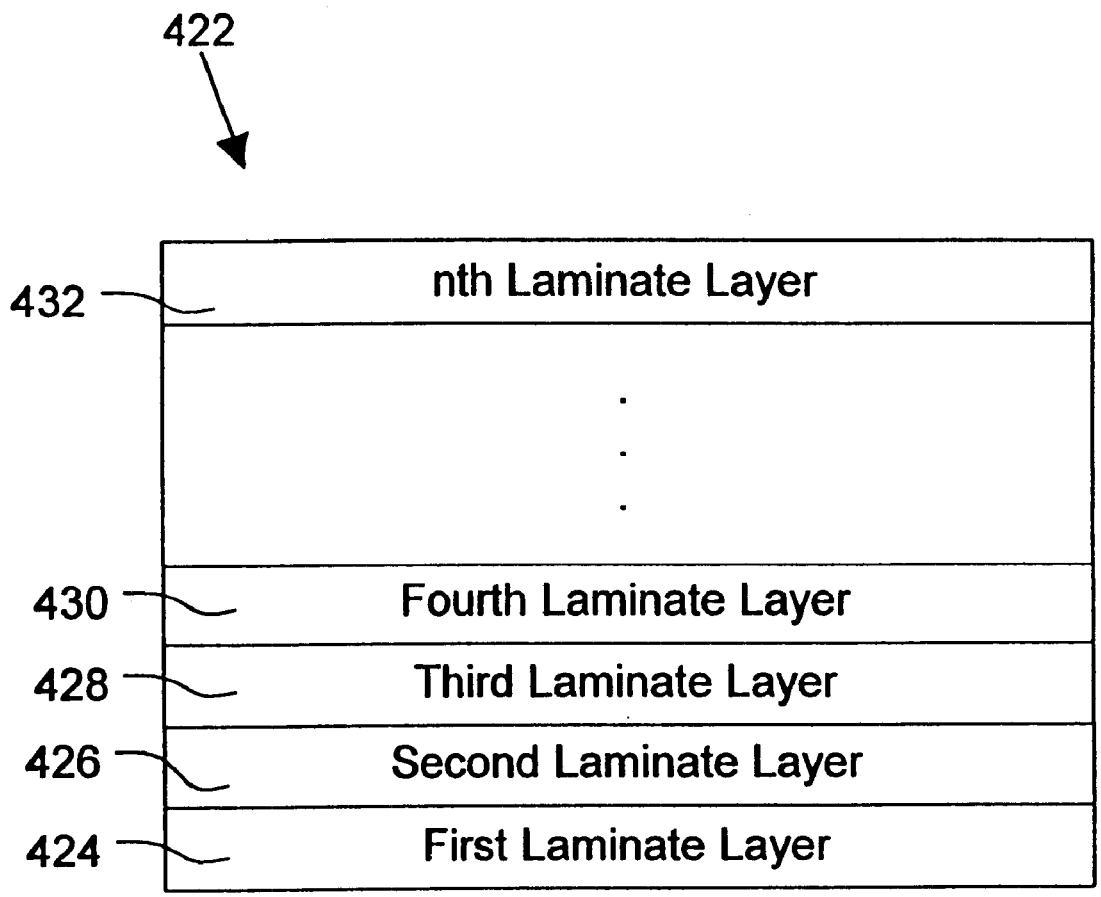
FIG. 6 is a cross-sectional view illustrating the composition of one embodiment of a second anti-parallel (AP)-pinned layer according to the present invention.

The second AP-pinned layer 422 is, in one embodiment, configured as shown in FIG. 6. According to the present invention and as depicted in FIG. 6, the second anti-parallel parallel (AP)-pinned layer is formed of thin laminate layers. The first laminate layer 424 is preferably formed above the APC layer 420 and preferably consists of a suitable magnetic material such as CoFe. The second laminate layer 426 is preferably formed above the first laminate layer and preferably consists of a suitable oxide of the first laminate layer 424, such as CoFeO. The third laminate layer 428 is preferably formed above the second laminate layer 426 and preferably consists of a suitable magnetic material such as CoFe. The fourth laminate layer 430 is preferably formed above the third laminate layer 428 and preferably consists of a suitable oxide of the third laminate layer 428 such as CoFeO.

The above configuration of laminated metal layers separated by laminated oxide layers can be continued up to the nth laminate layer 432. The nth laminated layer comprises a suitable magnetic material such as CoFe. Preferably, the first AP-pinned layer 418 is pinned in a direction 448 opposite the direction 450 of the second AP-pinned layer 422.

When the above-described embodiment is used to form the first and second AP-pinned layers 418 and 422, the entire pinned layer 417 preferably has a thickness in a range of between about 24 Å and about 70 Å, and more preferably has a thickness of about 51 Å. The first AP-pinned layer 416 has a thickness preferably in a range of between about 10 Å and about 30 Å, with a more preferred thickness in a range of between about 15 Å to about 20 Å, and a most preferred thickness of about 17 Å.

The thicknesses of the first and second AP-pinned layers 418 and 422 are preferably simultaneously adjusted, as the performance of the spin valve sensor 400 depends upon the difference between those layers. This difference, the thickness of the first AP-pinned layer 418 subtracted from the thickness of the second AP-pinned layer 422, should be kept within a range of between about 3 Å and about 20 Å.

The structure of the second AP-pinned layer 422 may be configured in many different embodiments, including varying numbers of nano oxide layers. However, the entire thickness of the second AP-pinned layer 422 is preferably kept within the relationship to the first AP-pinned layer 417 as described above. In the embodiment shown with one to n layers in the second AP-pinned layer 422, the layers consisting of CoFe have a thickness preferably in a range of between about 3 Å and about 7 Å, with a preferred thickness of about 5 Å. The layers consisting of CoFeO have a thickness preferably in a range of between about 3 Å and about 7 Å, with a preferred thickness of about 5 Å.

The spin valve sensor 400 as depicted also includes a spacer layer 434 formed over and in contact with the second AP-pinned layer 422. The spacer layer 434 is preferably formed of a GMR promoting material such as copper (Cu), although it may also be formed of other GMR promoting materials such as gold (Au) or silver (Ag). The thickness of the spacer layer 434 is preferably in a range between about 15 Å and about 30 Å, with a more preferred range of about 18 Å to about 25 Å, and a most preferred value of about 21 Å.

A free ferromagnetic layer 436 is shown formed over and adjacent to the spacer layer 434. In order to provide the advantages of the present invention, the free ferromagnetic layer 436 is preferably formed with a material having a high degree of magnetoresistance. One example of such a material is a Co—Fe alloy. Preferably, the free ferromagnetic layer 436 maintains magnetic softness HK through the use of a structure in which the Co—Fe alloy of the free layer 436 is laminated with a second material. In the depicted embodiment, the free layer 436 contains a resistive layer 438 and a lamination layer 440. The resistive layer 438 is preferably formed with a material having a high degree of magnetoresistance such as a Co—Fe alloy. The lamination layer 440 is preferably formed of NiFe or a similar material selected for its high magnetoresistance and low magnetostriction.

Preferably, when configured with CoFe and NiFe, the free layer 436 has a total thickness in a range of between about 25 Å and about 75 Å, with a more preferred thickness in a range of between about 35 Å and about 55 Å, and a most preferred thickness of about 45 Å. Accordingly, the resistive layer 438 has a total thickness in a range of between about 5 Å and about 15 Å, with a more preferred thickness in a range of between about 10 Å and about 15 Å, and a most preferred thickness of about 15 Å. Furthermore, the lamination layer 440 has a thickness preferably in a range of between about 20 Å and about 60 Å, with a more preferred thickness in a range of between about 25 Å and about 40 Å, with the most preferred thickness of about 30 Å.

The lamination layer 440 may be comprised of materials in addition to the preferred NiFe alloy. For example, the addition of Co to the NiFe alloy has been found to substantially increase the overall magnetoresistance of the free layer 436, while not substantially decreasing the magnetic hardness $H_K$ of the free layer 436. Materials such as chromium, tantalum, rhodium, and molybdenum may also be added to the NiFe alloy to increase the resistance of the lamination layer 440 and thereby enhance the amount of current passing through the resistive layer 438.

Referring again to FIG. 5, the spin valve sensor 400 is shown with a cap layer 442 formed over the free layer 436 to protect the material deposited in the central region 404 against oxidation. The cap layer 442 is preferably made of tantalum (Ta), but of course, any suitable material may be used. The spin valve sensor 400 is also shown formed with a pair of longitudinal biasing layers 444 formed in the end regions 402. The biasing layers 444 are preferably formed of a hard material such as a CoPtCr alloy and are used for longitudinally biasing the central region 404.

A pair of electrical leads 446 are also shown formed over the biasing layers 444 and are employed to form a circuit path between the spin valve sensor 400, a current source 452 and a sensing device 454. In the preferred embodiment, the sensing device 454 detects the voltage signal between the two leads 446, which changes with the changing magnetic signals on the disk.

The sensed voltage signal arises from a change in resistance, $\Delta R$, of the central portion 404 as the magnetization direction $M_F$ of the free layer 436 rotates in response to the applied magnetic signal from the recorded medium. The sensing device may include a digital recording channel such as a partial-response maximum likelihood (PRML) channel as is known to those skilled in the art. Alternatively, the sensing device may include a peak-detect channel as is known to those skilled in the art. In one embodiment, the sensing device includes a digital recording channel of PRML type.

Preferred alloys and concentrations for the present invention may be as follows. A currently preferred example of the Co—Fe alloy for use in the first AP-pinned layer 417, the magnetic laminate layers in the second AP-pinned layer 424, 428, 432 and the resistive layer 426 is $Co_{90}Fe_{10}$. A preferred example of the CoFe oxide for use in the second AP-pinned layer is $Co_{50}Fe_{10}O_{40}$. A preferred example of the Ni—Fe alloy for use in the lamination layer 440 is $Ni_{81}Fe_{19}$. A preferred example of the Mn based alloy used in the AFM layer 416 is $Pt_{40}Mn_{60}$.

From the above discussion, it should be readily apparent that the improved spin valve structure of the present invention improves the GMR coefficient and, therefore the measuring sensitivity of the spin valve. The addition of the thin laminate layers in the second AP-pinned layer increases both electron scattering within the spin valve sensor and the overall magnetic stability of the spin valve sensor.

The present invention may be embodied in other specific forms without departing from its essential characteristics. The described embodiments are to be considered in all respects as only illustrative and not restrictive. The scope of the invention is, therefore, indicated by the appended claims rather that by the foregoing description. All changes which come within the meaning and range of equivalency of the claims are to be embraced within their scope.

What is claimed and desired to be secured by United States Letters Patent is:

1. A spin valve sensor, comprising;
   a substrate;
   a seed layer formed on the substrate;
   an antiferromagnetic (AFM) layer formed to a side of the seed layer;
   a first anti-parallel (AP)-pinned layer formed to a side of the AFM layer;
   a second anti-parallel (AP)-pinned layer comprising a plurality of thin laminate layers including at least one laminated oxide layer, the second AP-pinned layer separated from the first AP-pinned layer by an anti-parallel coupling (APC); and
   a free layer, the first and second AP-pinned layers separated from the free layer by a spacer layer.

2. The spin valve sensor of claim 1, wherein the second anti-parallel (AP)-pinned layer comprises Co in a range of between about 45 and 55 percent and Fe in a range of between about 10 and 20 percent and Oxygen in a range of between about 30 and 40 percent.

3. The spin valve sensor of claim 1, wherein the second AP-pinned layer has a thickness in a range of between about 15 Å and about 30 Å.

4. The spin valve sensor of claim 1, wherein the second anti-parallel AP-pinned layer comprises a plurality of metal laminate layers separated by the at least one laminated oxide layer.

5. The spin valve sensor of claim 4, wherein the metal laminate layers comprise Co.

6. The spin valve sensor of claim 4, wherein the metal laminate layers comprise CoFe.

7. The spin valve sensor of claim 4, wherein the at least one laminated oxide layer comprises CoFeO.

8. The spin valve sensor of claim 1, wherein the AFM layer comprises PtMn.

9. A spin valve sensor, comprising;
   a substrate;
   a seed layer formed on the substrate and containing a face centered cubic material forming a (111) crystallographic plane substantially parallel to the substrate;
   an antiferromagnetic (AFM) layer comprising PtMn, formed to a side of the seed layer;
   a first anti-parallel AP-pinned layer comprising Co or CoFe, formed to a side of the AFM layer;
   a second anti-parallel AP-pinned layer comprising a plurality of thin laminate layers including at least one laminated oxide layer, the second AP-pinned layer separated from the first AP-pinned layer by an anti-parallel coupling (APC); and
   a free layer, the first and second AP-pinned layers separated from the free layer by a spacer layer.

10. The spin valve sensor of claim 9, wherein the second anti-parallel AP-pinned layer comprises about 50 percent Co and about 10 to 20 percent Fe and about 30 to 40 percent Oxygen.

11. The spin valve sensor of claim 10, wherein the second anti-parallel AP-pinned layer has a thickness of between about 15 Å and 30 Å.

12. The spin valve sensor of claim 11, wherein the second anti-parallel AP-pinned layer comprises a plurality of metal laminate layers separated by the at least one laminated oxide layer, wherein the metal laminate layers comprise CoFe.

13. The spin valve sensor of claim 12, wherein the at least one laminated oxide layer comprises CoFeO.

14. A disk drive system, comprising;
   a spin valve sensor comprising;
      a substrate;
      a seed layer formed on the substrate;
      an antiferromagnetic (AFM) layer formed to a side of the seed layer;
      a first anti-parallel AP-pinned layer formed to a side of the AFM layer;
      a second anti-parallel AP-pinned layer comprising a plurality of thin laminate layers including at least one laminated oxide layer, the second AP-pinned layer separated from the first AP-pinned layer by an anti-parallel coupling (APC); and a free layer, the first and second AP-pinned layers and the free layer separated by a spacer layer;

an actuator for moving the spin valve sensor across a magnetic recording disk so the spin valve sensor may access different regions of magnetically recorded data on the magnetic recording disk; and a detector coupled to the spin valve sensor for detecting changes in resistance of the sensor caused by rotation of a magnetization axis of the free ferrromagnetic layer relative to a fixed magnetization of the AP pinned layer in response to magnetic fields from the magnetically recorded data.

15. The disk drive system of claim 14, wherein the second AP-pinned layer has a thickness in a range of between about 15 Å and about 30 Å.

16. The spin valve sensor of claim 15, wherein the AFM layer comprises PtMn.

17. The disk drive system of claim 14 wherein the second anti-parallel AP-pinned layer comprises a plurality of metal laminate layers separated by the at least one laminated oxide layer.

18. The disk drive system of claim 17, wherein the metal laminate layers comprise Co.

19. The spin valve sensor of claim 17, wherein the metal laminate layers comprise CoFe.

20. The spin valve sensor of claim 17, wherein the at least one laminated oxide layer comprises CoFeO.

* * * * *

UNITED STATES PATENT AND TRADEMARK OFFICE
CERTIFICATE OF CORRECTION

PATENT NO. : 6,452,763 B1
DATED : September 17, 2002
INVENTOR(S) : Gill

It is certified that error appears in the above-identified patent and that said Letters Patent is hereby corrected as shown below:

Title page,
Item [57], ABSTRACT,
Line 3, "(AP) pinned" should read -- (AP)-pinned --.
Line 7, "AP-pinned" should read -- (AP)-pinned --.

Column 4,
Lines 13 and 43, "AP-pinned" should read -- (AP)-pinned --.
Line 37, "(AP1)-pinned" should read -- (AP)-pinned --.

Column 10,
Lines 19, 37 and 39, "AP-pinned" should read -- (AP)-pinned --.
Lines 47, 51 and 54, "AP-pinned" should read -- (AP)-pinned --.
Lines 65 and 67, "AP-pinned" should read -- (AP)-pinned --.

Column 12,
Line 6, "14 wherein" should read -- 14, wherein --.
Line 7, "AP-pinned" should read -- (AP)-pinned --.

Signed and Sealed this

Eleventh Day of February, 2003

JAMES E. ROGAN
*Director of the United States Patent and Trademark Office*